United States Patent [19]

Hamill et al.

[11] Patent Number: 5,207,587
[45] Date of Patent: May 4, 1993

[54] ELECTRICAL DISTRIBUTION CENTER

[75] Inventors: Brian D. Hamill, Warren; Theodore R. Schmidt, Kinsman; Aaron D. Monroe, Cortland; Patrick S. Kiraly, Youngstown; Jay H. Garretson, Warren, all of Ohio

[73] Assignee: General Motors Corporation, Detroit, Mich.

[21] Appl. No.: 888,760

[22] Filed: May 27, 1992

[51] Int. Cl.$^5$ .............................................. H05K 7/06
[52] U.S. Cl. ..................................... 439/76; 361/399; 439/403
[58] Field of Search ................... 439/34, 76, 402, 403, 439/404, 405, 43, 49, 189; 361/360, 395, 399, 406, 412, 414

[56] References Cited

U.S. PATENT DOCUMENTS

| | | | |
|---|---|---|---|
| 4,684,765 | 8/1987 | Beck et al. | 439/43 |
| 4,894,018 | 1/1990 | Phillips et al. | 439/81 |
| 5,023,752 | 6/1991 | Detter et al. | 361/399 |
| 5,067,905 | 11/1991 | Matsumoto et al. | 439/76 |

OTHER PUBLICATIONS

Transition Block Assembly Drawing No. 1206 6073, Aug. 1986.

Primary Examiner—Neil Abrams
Attorney, Agent, or Firm—William A. Schuetz

[57] ABSTRACT

An electrical distribution center electrically interconnects electrical and electronic devices and electrical connectors of wiring harnesses. The electrical distribution center comprises a main bus plate that includes a plurality of stamped metal circuit components that are insert molded in an insulation board. The stamped metal circuit components have a plurality of male blade terminals that project outwardly of the insulation board and that include wire receiving slots. The main bus plate is sandwiched between upper and lower bus plates that each include a plurality of wire circuit components in an insulated routing board that has slots extending through it. The male blade terminals of the main bus plate project through the slots of the upper and lower bus plates for connection with the electrical and electronic components and the electrical connectors of the wiring harnesses. The wire receiving slots of selected male blade terminals receive the wire circuit components of the upper and lower bus plates as the selected male blade terminals pass through the slots to provide bussing between various male blade terminals.

3 Claims, 5 Drawing Sheets

ELECTRICAL DISTRIBUTION CENTER

BACKGROUND OF THE INVENTION

This invention relates generally to electrical distribution centers and more specifically to electrical distribution centers that use bus plates for interconnecting terminals that are mated to electrical or electronic devices or electrical connectors of wiring harnesses.

U.S. Pat. No. 5,023,752 granted to Gary C. Detter et al Jun. 11, 1991 discloses such an electrical distribution center for automotive use. This electrical distribution center utilizes stamped metal circuit components to conduct current through internal circuitry. It involves multiple layers of stamped metal circuit components that are heat-staked into corresponding tracks of thermoplastic insulator plates. These plate assemblies are stacked and secured together in a unit handled bussing sub-assembly. The stamped metal circuit components include male blade terminals that pass through slots of the insulator plates and project outwardly of the sub-assembly to mate to electrical connectors of wiring harnesses or to electrical and electronic devices via double ended female terminals. The bussing sub-assembly is disposed and secured within a two-piece thermoplastic housing that has plug-in portions for receiving the electrical connectors of the wiring harnesses and the electrical and electronic devices.

While this electrical distribution center has been successfully used by General Motors Corporation in its Saturn automotive vehicles, it has a significant drawback in that changes in the internal circuitry are expensive due largely to the inflexibility of the stamped metal circuit components. Each stamped metal circuit component is produced from a unique stamping die and a unique mold die is used to produce each insulator plate with the corresponding circuit tracks. Because of this situation, any change in circuit configuration, regardless of how minor, forces tool revisions for the stampings and insulator plates. This is not only costly but also requires long lead times for the tool revisions. Moreover, completely new tooling may be required if significant changes are involved.

It is also known from U.S. Pat. No. 4,684,765 granted to Lawrence R. Beck et al Aug. 4, 1987 and junction blocks produced by the Packard Electric Division of General Motors Corporation to provide a junction block comprising double ended male blade terminals that are insert molded into a housing plate and upper and lower bussing plates each comprising a routing board and solid core copper wire routed onto the routing board. Each end of the male blade terminals projects outwardly of the housing plate and each end has a wire receiving slot of the insulation displacement type near the base of its blade. The upper and lower bussing plates are assembled to the housing plate by pressing the upper and lower bussing plates over the projecting ends of the male blade terminals. This action forces the solid core wire into the wire receiving slots creating bussing circuits between the male blade terminals. When electrical female connectors of wiring harnesses are mated to each side of the junction block, the routed wires provide for bussing between the various wiring harnesses.

As indicated in the Beck patent, the routing of the wire onto the routing boards is an automatic process which can quickly be reprogrammed to create any configuration of wire routing. Thus, bussing circuit configurations are easy to create and change with minimal cost and time. This routed wire technology provides flexibility in bussing. However, it too has a major drawback in that the present routed wire technology has a relatively low current carrying capability and consequently it is not suitable for use in automotive applications such as electrical distribution centers that require relatively high current carrying capability for many of the circuits.

SUMMARY OF THE INVENTION

The object of this invention is to provide an electrical distribution center for automotive use that has a great deal of flexibility in creating and changing circuit configurations between the electrical and electronic devices and the electrical connectors of the wiring harnesses that are plugged into the electrical distribution center as well as the relatively high current capability required for many of the automotive circuits.

This object is generally achieved by combining and integrating the high current capability of stamped metal circuit components and the flexibility of routed wire bussing in a unique and advantageous way.

Other objects, features and advantages of the invention will become apparent to those skilled in the art as disclosure is made in the following detailed description of a preferred embodiment of the invention which sets forth the best mode of the invention contemplated by the inventors and which is illustrated in the accompanying sheet(s) of drawing.

DETAILED DESCRIPTION OF THE PREFERRED EMBODIMENT

Figure 1:
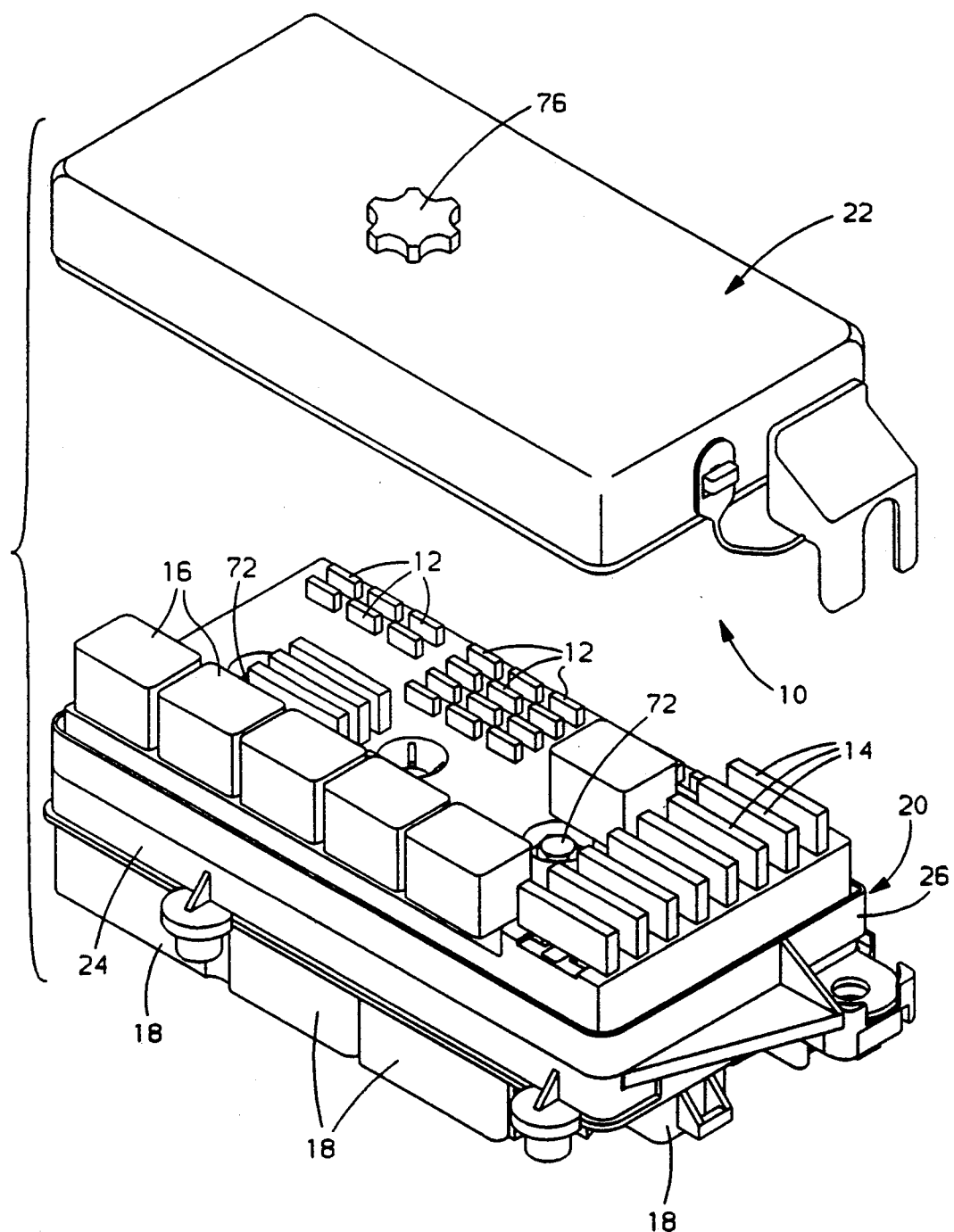
FIG. 1 is a perspective view of an electrical distribution center in accordance with the invention. The cover is shown in a raised position to illustrate the electrical and electronic components that are plugged into the electrical distribution center.

Referring now to the drawing and more particularly to FIG. 1, an electrical distribution center 10 provides electrical interconnections between electrical and electronic devices (such as mini-fuses 12, maxi-fuses 14 and relays 16 that are plugged into the top of the electrical distribution center 10) and electrical connectors of wiring harnesses (not shown) that are plugged into a plurality of connector sockets 18 in the bottom of the electrical distribution center 10.

The electrical distribution center 10 includes a housing 20 and cover 22 that are molded from a thermoplastic electrically insulative material. The housing 20 comprises a lower housing 24 and an upper housing 26. The connector sockets 18 for receiving the electrical connectors of the wiring harnesses (not shown) are molded as an integral part of the lower housing 24. The mini-fuses 12, maxi-fuses 14 and relay 16 are plugged into terminal cavities in the upper housing 24 and held in place by the cover 22 when it is attached to the housing 20. This feature is explained in U.S Pat. No. 5,023,752 that was granted to Gary C. Detter et al Jun. 11, 1992 for an Electrical Power Distribution Center and that is incorporated in this patent specification by reference.

The electrical distribution center 10 comprises several components that are disposed within the housing 20 as shown in FIGS. 2 through 6. These include a main bus plate 28 that is sandwiched between upper and lower bus plates 30 and 32.

The main bus plate 28 comprises a plurality of stamped metal circuit components 34 and 34a and an insulation board 36 of molded thermoplastic material for fixing the stamped metal circuit components 34 and 34a in a predetermined pattern. Two different general types of stamped metal circuit components 34, 34a are used, however, each type includes male blade terminals 38 and/or 38a that protrude from the insulation board 36. One general type of stamped metal circuit component comprises a flat planar body interconnecting a plurality of male blade terminals 38 and/or 38a that are perpendicularly attached at the edges of the body. These male blade terminals 38 and/or 38a may be bent upwards to protrude above the insulation board 36 or bent downwards to protrude below the insulation board 36. Moreover the male blade terminals 38 and/or 38a may extend in the same or in opposite directions whereby the stamped metal circuit components 34 and 34a includes either U-shaped portions or Z-shaped portions when viewed on end.

Another general type of stamped circuit component 34 comprises a series of male blade terminals 38 or 38a connected by a carrier strip that is coplanar with the male blade terminals 38 or 38a. This latter general type includes variants such as a single pair of oppositely extending male blade terminals, several pairs of such terminals strung together by a carrier strip, and several male blade terminals strung together where some are double ended male blade terminals and some are single ended male blade terminals extending in one direction or another. In any event, the main bus plate 28 comprises one or more stamped metal circuit components 34 and 34a having male blade terminals 38 and 38a arranged in a predetermined pattern and maintained in this predetermined pattern by the insulator board 36, preferably by insert molding the stamped metal circuit components 34 in an insulator board 36 of molded thermoplastic material. One advantage of insert molding the stamped metal circuit components 34 and 34a is that it immobilizes the male blade terminals 38 and 38a so that there is little, if any, relative movement between the male blade terminals 38 and 38a and the electrical wires that they are connected to it as described below. This is important in maintaining the integrity of the these electrical connections. Another advantage is that insert molding is an efficient manufacturing process that reduces the number of components and manufacturing cost.

Figure 6:
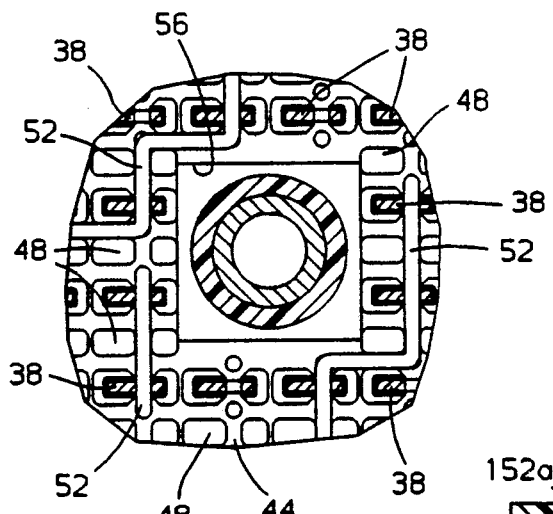
FIG. 6 is a section taken substantially along the line 6—6 of FIG. 5 looking in the direction of the arrows.
Figure 5:
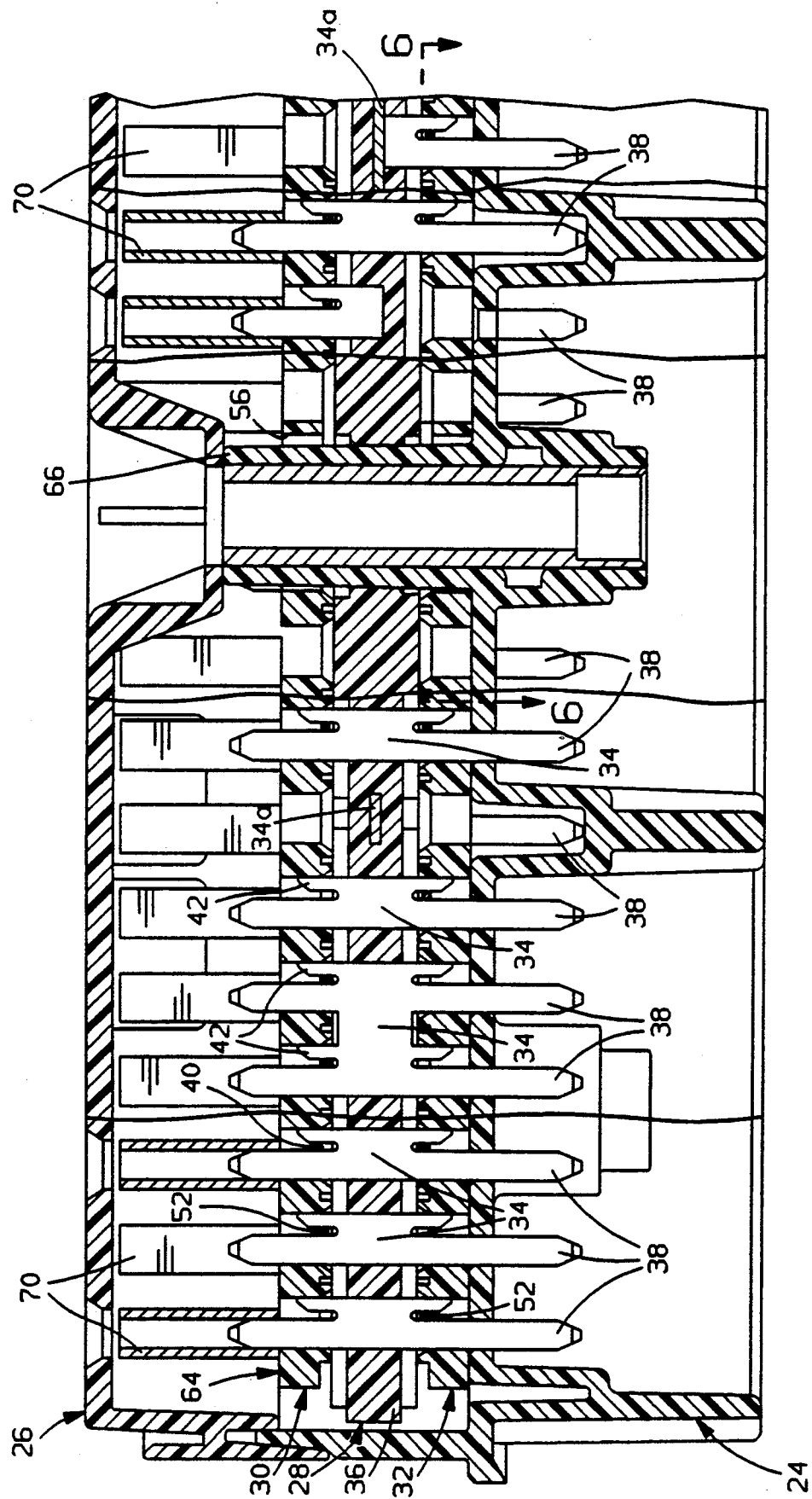
FIG. 5 is a section taken substantially along the line 5—5 of FIG. 2 looking in the direction of the arrows.

Nearly all of the male blade terminals 38 and 38a include a narrow wire receiving slot or slots 40 of the insulation displacement type near the base of its blade that is provided by a short finger 42 disposed on one or both side of the blade as best shown in FIGS. 5 and 6. The width of the wire receiving slots 40 is narrower than the conductor core of the wire it receives so that electrical contact is established when the wire is pushed into the slot in a well know manner.

The stamped metal circuit components 34, 34a have a relatively high current carrying capacity and thus are adequate for even the highest currents normally encountered in automotive wiring circuits, i.e. up to about 40 amps continuous current. This is especially necessary for the main stamped metal circuit component 34a that is a power bus that includes an ear portion 34b for connection to a battery cable (not shown) and high capacity male terminal blades 38a for connection to maxi-fuses 14.

The upper and lower bus plates 30 and 32 each comprise a routing board 44 of electrically insulative thermoplastic material that includes a plurality of terminal stations 46 and a plurality of guide stations 48. The terminal and guide stations are raised and separated from each other so as to provide a network of wire channels that communicate with wire passages that extend through the terminal and guide stations. The terminal stations 46 also have terminal slots 50 that extend through the routing board 44 to intersect the wire passages.

The upper and lower bus plates 30 and 32 each further include electrical busses comprising lengths of electrically conductive wire 52 that pass through various terminal and guide stations via the network of wire channels in a predetermined pattern. Suitable bus plates and a suitable method of their manufacture are disclosed in greater detail in U.S. Pat. No. 4,684,765 that was granted to Lawrence R. Beck et al Aug. 4, 1987 for a Bus Assembly and Method for Making Same and that is incorporated in this patent specification by reference.

The electrically conductive wire 52 that is used in the upper and lower bus plates 30 and 32 is preferably a solid core 20 gage copper wire which is easily routed onto the routing boards 44 and also adequate to carry the relative low current bussing between wiring harness, i.e. up to about 15 amps continuous current. As indicated in the Beck patent, the routing of the wire 52 onto the routing boards 44 is an automatic process that can be reprogrammed quickly to create any configuration of wire routing. Thus the low current bussing circuits (that are most likely to change often for automotive wiring applications) are created and changed easily with minimal cost and time. This flexibility in bussing provided by the routed wire bus plates 30 and 32 combined with the high current carrying capacity of the stamped metal circuit bus plate 28 is a major feature and advantage of this invention.

The routing boards 44 that are used in the upper and lower bus plates 30 and 32 are preferably identical in order to minimize the number of parts and reduce production costs. The routing boards 44 are assembled to the main bussing plate 28 with their respective networks of wire channels facing the main bus plate 28. Thus the routing board 44 for the upper routed wire bus plate 30 is shown upside down while the identical routing board 44 for the lower bus plate 32 is shown right side up as viewed in the patent drawing.

Figure 4:
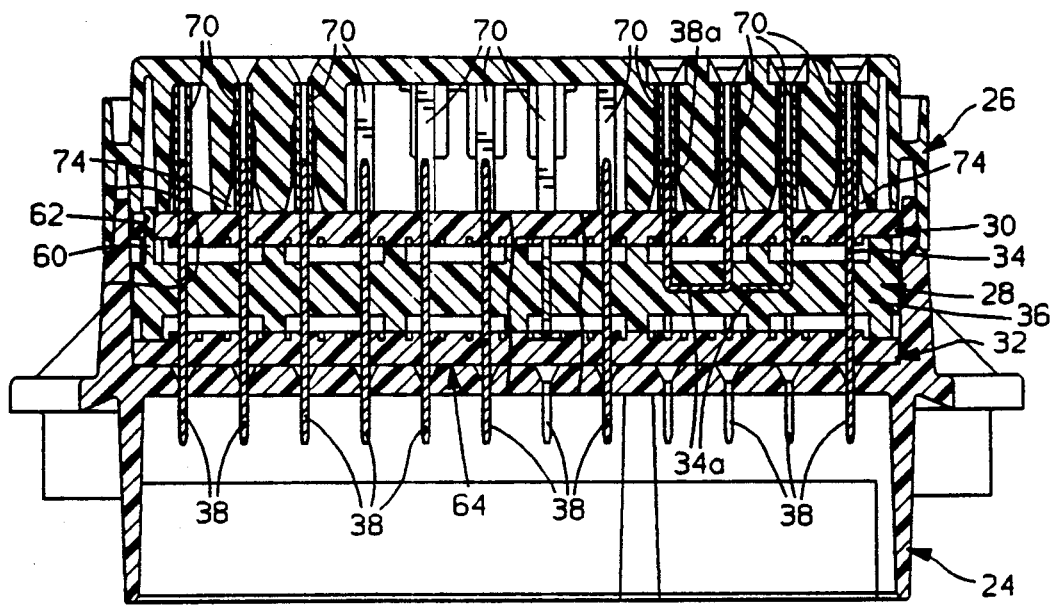
FIG. 4 is a section taken substantially along the line 4—4 of FIG. 2 looking in the direction of the arrows.

After completion, the bus plates 30 and 32 are assembled to the main bus plate 28 one at a time by pressing their respective routing boards 44 over the protruding male blade terminals 38, 38a of the main bus plate 28 which pass through the terminal slots 50 as the routed wire bus plates 30 and 32 are pressed onto the main bus plate 28. This action forces the solid core wire 52 into the wire receiving slots 40 of the male blade terminals 38, 38a establishing electrical connections and creating bussing circuits between the male blade terminals 38, 38a as shown in FIGS. 4, 5 and 6.

The main bus plate 28 has a plurality of round mounting holes 54 while the routing boards 44 for the upper and lower bus plates 30 and 32 have larger square holes 56 as best illustrated in FIG. 6. These larger square holes 56 leave the surfaces of the insulation board 36 of the main bus plate 28 that are adjacent the round mounting holes 54 exposed after a routed wire bus plate 30 or 32 is pressed on. After one routed wire bus plate is assembled to the main bus plate 28, these exposed surfaces are used to support the main bus plate 28 for assembly of the second routed wire bus plate on the opposite side of the main bus plate.

The main bus plate 28 includes a plurality of integral raised abutments 58 and integral posts 60 on its upper and lower surface. The raised abutments 58 engage the guide stations 48 and hold down any wires 52 that pass through the guide stations when the routed wire plates 30 or 32 are pressed onto the main bus plate 28. The integral posts 60 that are adjacent the longer edges of the insulation board 36 are received in mating holes 62 of the routing boards 44 of the bus plates 30 and 32 when these bus plates are pressed onto the main bus plate 28. The integral posts 60 are heat staked or otherwise headed after the routed wire bus plates 30 and 32 are pressed on so that the main bus plate 28 and routed wire bus plates 30 and 32 are immobilized with respect to each other and form a unit handled sub-assembly 64 as best shown in FIG. 4. The immobilization provided by the formation of the unit handled sub-assembly 64 together with the immobilized male blade terminals 38 and 38a of the insert molded main bus plate 28 enhances the electrical connections between the male blade terminals 38 and 38a and the wires 52 that are received in the wire receiving slots 40 because there is virtually no movement between these components due to vibration or shock.

The unit handled sub-assembly 64 is assembled into the lower housing 24 and properly located by three longitudinally spaced, integral hollow stems 66 in the lower housing 24. The lower housing 24 has a plurality of slots 68 that extend through its floor so that the male blade terminal 38, 38a of the sub-assembly 64 that protrude below the sub-assembly pass through the floor and into the connector sockets 18 depending from the bottom of the housing 24.

Figure 2:
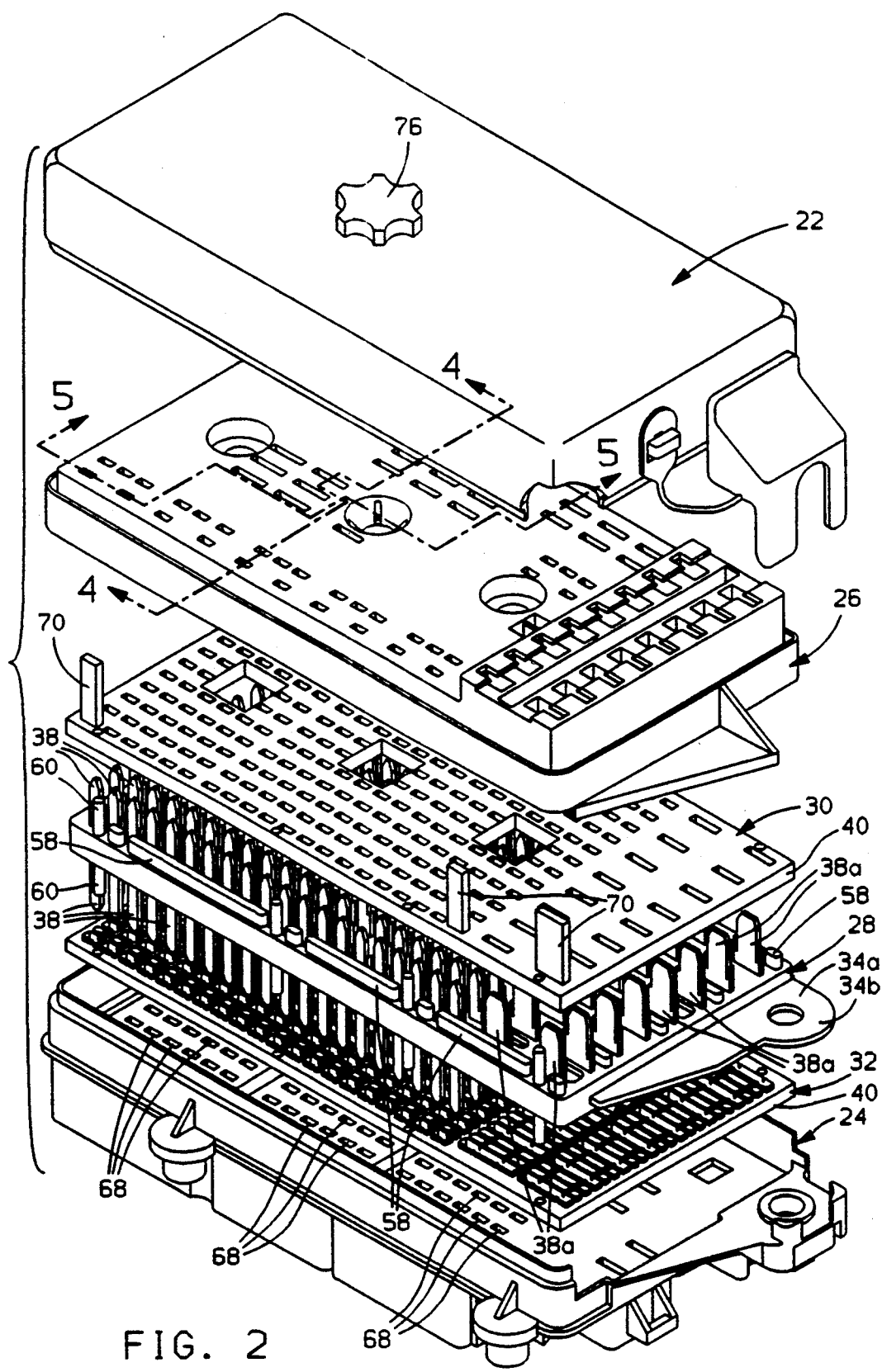
FIG. 2 is an exploded perspective view of the electrical distribution center that is shown in FIG. 1.
Figure 3:
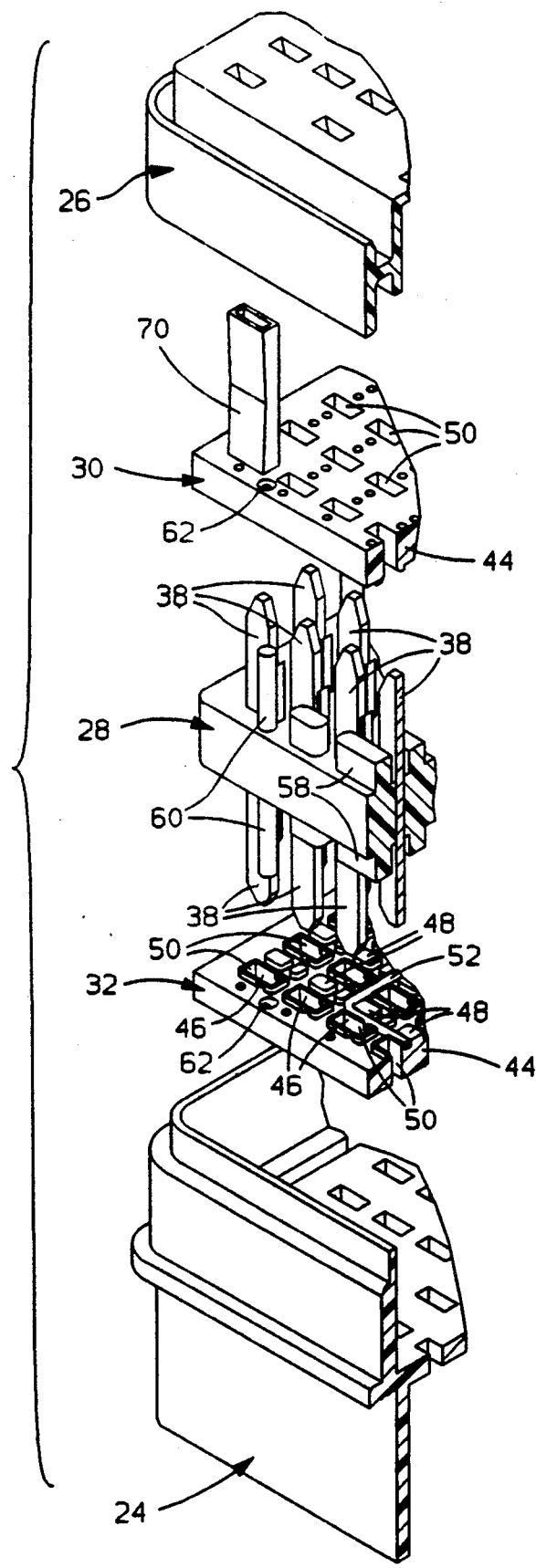
FIG. 3 is an enlargement of a corner portion of FIG. 2.

After the unit handled sub-assembly 64 is placed in the lower housing 24, double ended female terminals 70 are fitted onto selected ones of the male blade terminals 38, 38a that protrude above the sub-assembly 64. The upper housing 26 is then fitted on the lower housing 24 and secured by bolts 72 screwed into the two end hollow stems 66. The attached upper housing 26 holds the sub-assembly 64 against the floor of the lower housing 24 as shown in FIG. 4. The upper housing 26 also has elongated terminal cavities 74 that receive the double ended female terminals 70 that are attached to the protruding upper ends of selected male blade terminals 38, 38a. The elongated terminal cavities 74 have slot shaped entrances that open onto the upper surface of the upper housing 26 as shown in FIG. 2 so that the mini-fuses 12, maxi-fuses 14, and relays 16 can be plugged into the electrical distribution center as shown in FIG. 1. These electrical and electronic devices are then preferably held down and protected by the cover 22 which is secured to the center hollow stem 66 by a knobbed fastener 76 that has a threaded shank.

Figure 7:
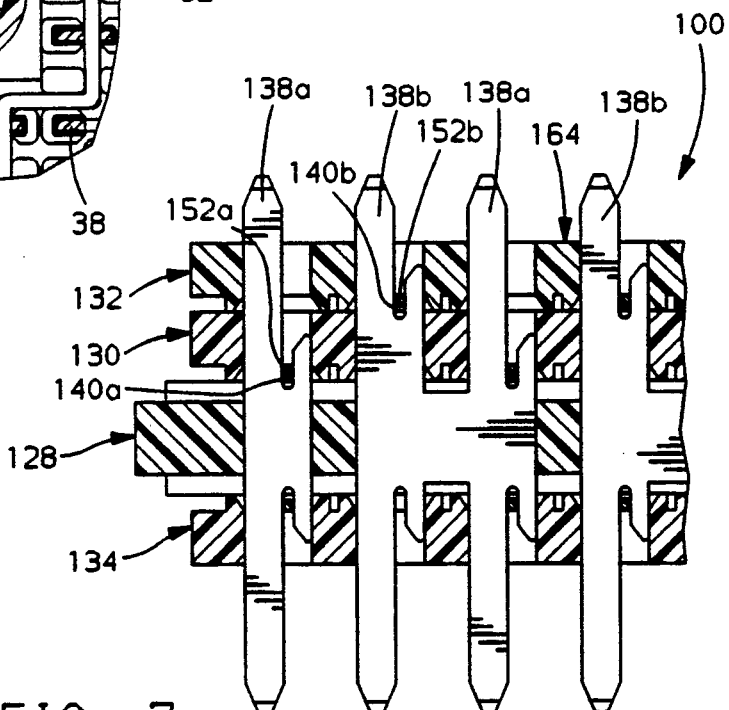
FIG. 7 is a fragmentary view of an alternate embodiment of the invention.

While we have illustrated the sub-assembly 64 as comprising three stacked bus plates, that is a main "stamped metal circuit" bus plate 28 sandwiched between two "routed wire" bus plates 30 and 32, it is also possible to add more bus plates. For instance, FIG. 7 shows an alternate embodiment of an electrical distribution center 100 having a sub-assembly 164 that comprises a main "stamped metal circuit" bus plate 128 and three "routed wire" bus plates 130, 132 and 134. The main bus plate 128 has protruding male blade terminals 138a and 138b of different configurations to accommodate the two bus plates 130 and 132 that are pressed onto the upper surface of the main bus plate 128. More specifically, the male blade terminals 138a have low level wire receiving slots 140a that receive the wires 152a of the "routed wire" bus plate 130 that is immediately on top of the main bus plate 128. Conversely, the male blade terminals 138b have high level wire receiving slots 140b that receive the wires 152b of the "routed wire" bus plate 132 that is on top of the first "routed wire" bus plate 130.

The modified electrical distribution center 100 shown in FIG. 7 has a single "routed wire" bus plate 134 below the main bus plate 128. However, it too can be modified further to accommodate a fourth "routed wire" bus plate below the bus plate 134 by modifying the male blade terminals 138a and 138b to accommodate a fourth bus plate.

Other modifications within the spirit and scope of the invention are also possible. In other words, we wish it to be understood that we do not desire to be limited to the exact details of construction shown and described, for obvious modifications will occur to a person skilled in the art.

The embodiments of the invention in which an exclusive property or privilege is claimed are defined as follows:

1. An electrical distribution center for providing electrical interconnections between electrical and electronic devices and electrical connectors of wiring harnesses comprising:

a main bus plate that includes a plurality of stamped metal circuit components and an insulation board for fixing the stamped metal circuit components in a predetermined pattern, at least one of said stamped metal circuit components being connected to a relatively high current source and having a first plurality of male blade terminals that project outwardly of the insulation board, others of the stamped metal circuit components having second pluralities of male blade terminals that project outwardly of the insulation board and that include wire receiving slots, and a second bus plate that includes a plurality of wire circuit components of relatively low current carrying capacity and an insulated routing board for fixing the wire circuit components in a predetermined pattern, the second bus plate having first and second slots that extend through the insulated routing board, said wire circuit components extending across selected ones of said second slots, said first plurality of male blade terminals of said one of said stamped metal circuit components extending through said first slots of the second bus plate for connection with selected ones of said electrical and electronic components that are located on the opposite side of the second bus plate from the main bus plate, and the wire receiving slots of selected second male blade terminals receiving the wire circuit components of the second bus plate as the selected male blade terminals pass through said second slots of the second bus plate.

2. An electrical distribution center for providing electrical interconnections between electrical and electronic devices and electrical connectors of wiring harnesses comprising:

a main bus plate that includes a plurality of stamped metal circuit components that are insert molded in an insulation board for fixing the stamped metal circuit components in a predetermined pattern, at least one of said stamped metal circuit components being connected to a relatively high current source and having a first plurality of male blade terminals that project outwardly of the insulator board, other of the stamped metal circuit components having second pluralities of male blade terminals that project outwardly of the insulation board and that include wire receiving slots, and upper and lower bus plates that each include a plurality of wire circuit components of relatively low current carrying capacity and an insulated routing board for fixing the wire circuit components in a predetermined pattern, the upper and lower bus plates having first and second slots that extend through their respective insulated routing boards, said wire circuit components extending across selected ones of said second slots, and said first plurality of male blade terminals of said one of said stamped metal circuit components of said main bus plate extending through said first slots of the upper and lower third bus plates for connection with selected ones of said electrical and electronic components and electrical connectors of wiring harnesses that are located on the opposites side of the upper and lower bus plates from the main bus plate, and the wire receiving slots of selected second male blade terminals receiving the wire circuit components of the upper and lower bus plates as the selected male blade terminals pass through said second slots of the upper and lower bus plates.

3. An electrical distribution center for providing electrical interconnections between electrical and electronic devices and electrical connectors of wiring harnesses comprising:

a main bus plate that includes a plurality of stamped metal circuit components that are insert molded in an insulation board for fixing the stamped metal circuit components in a predetermined pattern, at least one of said stamped metal circuit components being connected to a relatively high current source and having a first plurality of male blade terminals that project outwardly of the insulator board.

others of the stamped metal circuit components having second pluralities of male blade terminals that project outwardly of the insulation board and that include wire receiving slots, and upper and lower bus plates that each include a plurality of wire circuit components of relatively low current carrying capacity and an insulated routing board having a network of channels in one surface for receiving and fixing the wire circuit components in a predetermined pattern, the upper and lower bus plates having first and second slots that extend through their respective insulated routing boards and with the second slots communicating with said network of channels, said wire circuit components in said network of channels extending across selected ones of said second slots, the upper and lower bus plates being disposed on opposite sides of the main bus plate and being pressed on the male blade terminals of the main bus plate until their respective one surface having the network of channels engages the insulation board of the main bus plate, the main, upper and lower bus plates having means for immobilizing the bus plates with respect to each other and forming a unit handled sub-assembly, said first plurality of male blade terminals of the main bus plate extending through said first slots of the upper and lower bus plates for connection with selected ones of said electrical and electronic components and electrical connectors of wiring harnesses that are located on the opposites side of the upper and lower bus plates from the main bus plate, and the wire receiving slots of selected second male blade terminals receiving the wire circuit components of the upper and lower bus plates as the selected male blade terminals pass through said second slots of the second and third bus plates.

* * * * *